United States Patent

Yang et al.

Patent Number: 6,167,101
Date of Patent: Dec. 26, 2000

[54] APPARATUS AND METHOD FOR CORRECTING A PHASE OF A SYNCHRONIZING SIGNAL

[75] Inventors: Her-Shin Yang; Chein-Pin Chen, both of Tainan Hsien; Chih-Wei Wang, Hsinchu, all of Taiwan

[73] Assignee: Industrial Technology Research Institute, Hsinchu Hsien, Taiwan

[21] Appl. No.: 09/123,456

[22] Filed: Jul. 28, 1998

[51] Int. Cl.[7] .................................. H03D 3/24
[52] U.S. Cl. .................. 375/376; 375/327; 375/356; 375/354; 375/373; 358/319; 365/45
[58] Field of Search .................... 375/376, 327, 375/356, 354, 373; 358/319; 365/45

[56] References Cited

U.S. PATENT DOCUMENTS

| | | | |
|---|---|---|---|
| 4,691,247 | 9/1987 | Honjo et al. | 358/319 |
| 5,193,035 | 3/1993 | Kanota et al. | 360/51 |
| 5,497,126 | 3/1996 | Kosiec et al. | 331/1 A |
| 5,731,843 | 3/1998 | Cappels, Sr. | 348/537 |
| 5,963,462 | 10/1999 | Engh et al. | 365/45 |

*Primary Examiner*—Stephen Chin
*Assistant Examiner*—Mohammed Lachhab
*Attorney, Agent, or Firm*—McDermott, Will & Emery

[57] ABSTRACT

The present invention discloses an apparatus and a method for correcting the phase of a synchronizing signal. A best clock timing on latching the data input can be achieved by the apparatus and the method provided. The apparatus of the present invention includes: a phase adjusting circuit for adjusting the phase; a phase lock loop being responsive to the phase adjusting circuit for generating a clock pulse signal; a latching circuit for generating a latched data pattern of the data input; a comparing circuit for comparing the latched pattern with the data input; and a switching circuit for varying a time delay of the phase adjusting circuit. The method of the present invention includes the following steps. At first, the phase of the synchronizing signal is delayed and a clock pulse signal is generated from a phase delayed synchronizing signal. Next, a test pattern is latched as a latched pattern by referencing the clock pulse signal. The latched pattern is then compared with the test pattern. If the latched pattern is different from the test pattern, a phase delay of the synchronizing signal is adjusted. The above steps of delaying the phase, generating the clock pulse signal, latching the test pattern, comparing the latched pattern, and adjusting the phase delay are repeated until the latched pattern is coincident with the test pattern.

17 Claims, 3 Drawing Sheets

APPARATUS AND METHOD FOR CORRECTING A PHASE OF A SYNCHRONIZING SIGNAL

TECHNICAL FIELD OF THE INVENTION

The present invention relates to a phase correction apparatus and method, and more specifically, to an apparatus and a method for automatically correcting the phase of a synchronizing signal or a timing pulse signal.

BACKGROUND OF THE INVENTION

In the application of video signal transferring and video image displaying process, the phase adjustment of a timing pulse signal or a synchronizing signal plays an important role in providing correct images. In general, video images are transferred and displayed by providing a series of synchronizing signal and image data. The synchronizing signal can include a horizontal synchronizing signal and a vertical synchronizing signal. For achieving a correct timing on latching the data signal, one of the horizontal synchronizing signal and the vertical synchronizing is adjusted with its phase. Most frequently, the horizontal synchronizing signal is picked and adjusted in phase for latching the data signal with a correct clock pulse to correct the problem like image distortion, which is came from the incorrect timing on latching the image data signal after it is transferred and processed.

Referring to FIG. 1, a schematic timing diagram of a horizontal synchronizing signal (Hsync) and a data signal (Data) is illustrated. A clock pulse can be generated by referencing the horizontal synchronizing signal. The clock pulse is employed to latch the data signal with correct timing. The timing of the clock pulse can be adjusted by adjusting the phase delay of the horizontal synchronizing signal. A circuit for adjusting the phase delay is shown in FIG. 2. A phase delaying circuit 10 is employed to generate a phase delayed horizontal synchronizing signal (Hsync2). A phase lock loop (PLL), which is well known in the art, is responsive to the phase delayed horizontal synchronizing signal to generate a clock pulse (Dot clock), as illustrated in the figure.

In the prior art applications, the phase delaying circuit 10 is a RC delay circuit with a resistor R1 and a capacitor C1. The phase delay of the horizontal synchronizing signal can be adjusted by varying the time constant of the RC delay circuit 10. The phase of the clock pulse is then changed according to the phase delayed horizontal synchronizing signal in order to latch the data signal. The artificial process of adjusting the RC delay circuit 10 is time-consuming and the best clock timing is hard to achieve exactly with the manual operated adjusting process.

What is needed is a time-efficient phase correction method and apparatus to provide the best clock timing in latching the data signal, thus the distortion of the video image can be minimized and the quality and the accuracy of the image can be improved.

SUMMARY OF THE INVENTION

The present invention discloses an apparatus and a method for correcting the phase of a synchronizing signal or a timing pulse signal. The phase delay of the synchronizing signal can be correct automatically with reduced time compared with the prior art. A best clock timing on latching the data input can be achieved with the apparatus and the method provided.

The apparatus of the present invention includes: a phase adjusting circuit for adjusting the phase of the synchronizing signal; a phase lock loop being responsive to the phase adjusting circuit for generating a clock pulse signal; a latching circuit being responsive to a data input and the phase lock loop for generating a latched data pattern of the data input; a comparing circuit for comparing the latched pattern with the data input; and a switching circuit being responsive to the comparing circuit for varying a time delay of the phase adjusting circuit.

The method of the present invention includes the following steps. At first, the phase of the synchronizing signal is delayed and a clock pulse signal is generated from a phase delayed synchronizing signal. Next, a test pattern is latched as a latched pattern by referencing the clock pulse signal. The latched pattern is then compared with the test pattern. If the latched pattern is different from the test pattern, a phase delay of the synchronizing signal is adjusted. The above steps of delaying the phase, generating the clock pulse signal, latching the test pattern, comparing the latched pattern, and adjusting the phase delay are repeated until the latched pattern is coincident with the test pattern.

BRIEF DESCRIPTION OF THE DRAWINGS

The foregoing aspects and many of the attendant advantages of this invention will become more readily appreciated and better understood by referencing the following detailed description, when taken in conjunction with the accompanying drawings as follows.

DETAILED DESCRIPTION OF THE PREFERRED EMBODIMENT

The present invention discloses an apparatus and a method for automatically correcting the phase of a timing pulse signal or a synchronizing signal. By the combination of a phase adjusting circuit, a switching circuit, a latching circuit, and a comparing circuit, the phase delay of a synchronizing signal can be corrected automatically. The time-consuming prior art process can be replaced the method of the invention. Correction time can be greatly reduced and the best timing on latching the data input can be achieved.

Figure 1:
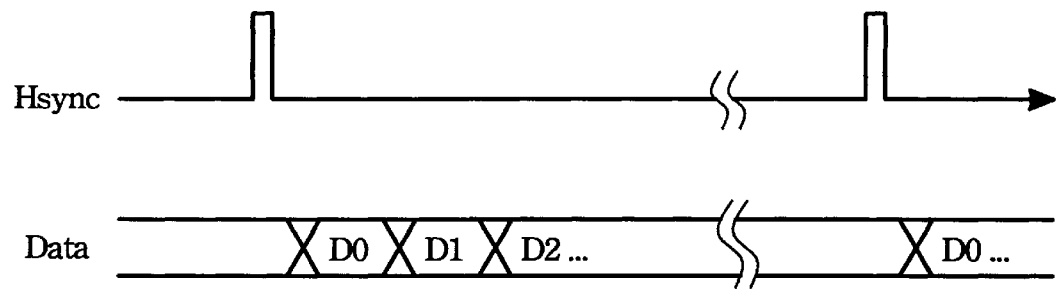
FIG. 1 illustrates a schematic timing diagram of a horizontal synchronizing signal and a data signal.
Figure 2:
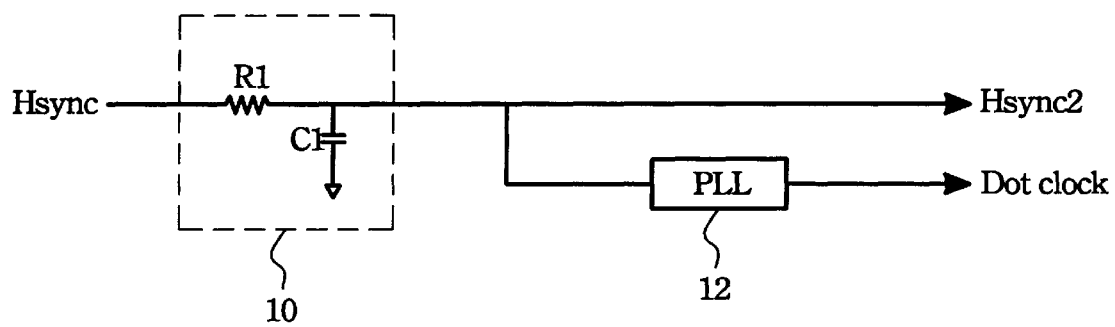
FIG. 2 illustrates a prior art circuit for delaying the phase of the horizontal synchronizing signal and generating a clock pulse signal.
Figure 3:
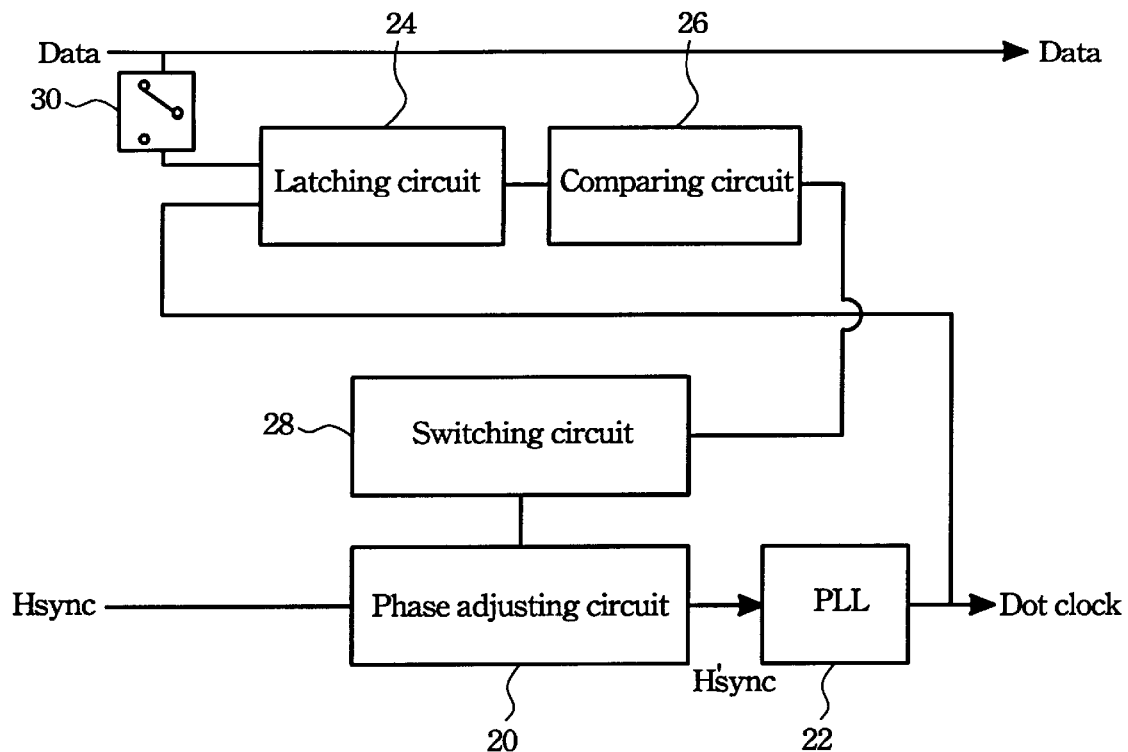
FIG. 3 illustrates a schematic diagram of the apparatus for correcting a phase of a synchronizing signal in accordance with the present invention.

Turning to FIG. 3, a schematic diagram of an apparatus proposed in the present invention is illustrated. The apparatus for correcting the phase of the synchronizing signal includes a phase adjusting circuit 20, a phase lock loop (PLL) 22, a latching circuit 24, a comparing circuit 26, and a switching circuit 28. As an example, the synchronizing signal is a video synchronizing signal, and is more specifically a horizontal synchronizing signal (Hsync) in the case.

Figure 4:
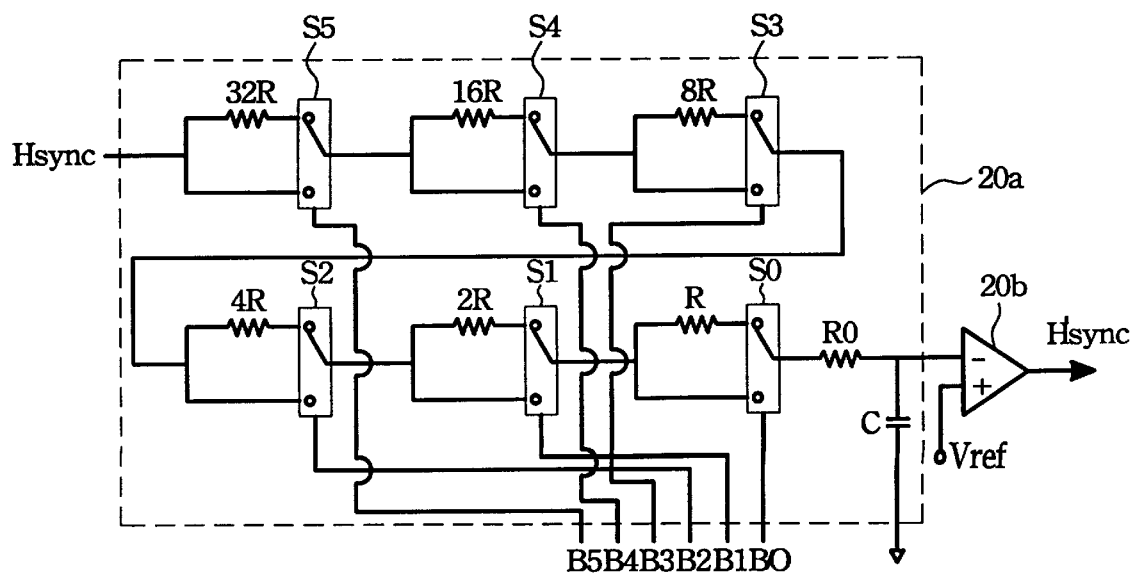
FIG. 4 illustrates a schematic diagram of the phase adjusting circuit in accordance with the present invention.

The phase adjusting circuit 20 is employed for adjusting the phase of the synchronizing signal. As a preferred embodiment, the phase adjusting circuit 20 can include a RC delay circuit 20*a* and an cascaded amplifier 20*b*, as shown in FIG. 4. The RC delay circuit 20*a* can have a plurality of resistors and a capacitor. In the case, the RC delay circuit 20*a* has a basic resistor R0 and six resistors respectively with a resistance of R, 2 R, 4 R, 8 R, 16 R, and 32 R. The resistance of the basic resistor can be set as R. The value of R can be determined with the specified signal and system design. The six resistors are selectable with the control of six corresponding switches S0, S1, S2, S3, S4, and S5. The six switches S0, S1, S2, S3, S4, and S5 are controlled by the switching circuit 28 with the controlling pins B0, B1, B2, B3, B4, and B5. Thus the time constant of the RC delay circuit 20*a* can be adjusted freely in the specified range and more resistors can be utilized with the different need of the system and the signal being processed.

Turning to FIG. 3, the phase lock loop (PLL) 22, which is well known in the prior art, is employed for generating a clock pulse signal. Thus, the image signal in the data input can be latched in the latching circuit 24 by referencing the clock pulse signal. The latching circuit 24 is responsive to a data input and the phase lock loop (PLL) 22 for generating a latched data pattern of the data input. For making a correction of the phase delay, a predetermined test pattern can be send or included in the data input. A latched test pattern can be generated for making a comparison in the comparing circuit 26. The comparing circuit 26 compares the latched test pattern with the predetermined test pattern to determine if a correct phase delay is achieved.

Finally, the switching circuit 28 is responsive to the compared result of the comparing circuit. Therefore, a time delay of the phase adjusting circuit 20 can be adjusted with the switching circuit 28 by sending a controlling signal to the controlling pins B0, B1, B2, B3, B4, and B5, as illustrated in FIG. 4. In the case, a digital switching circuit can be used to send the binary controlling signal to the controlling pins B0, B1, B2, B3, B4, and B5.

For controlling the operation of the latching circuit 24, a switch 30 can be further included in the system. Once the correction process is finished and a correct clock pulse is acquired, the switch 30 can be switched to an off state to keep the data input from entering the latching circuit 24. Thus the operation of the latch circuit 24 and the comparing circuit 26 are disabled.

Figure 5:
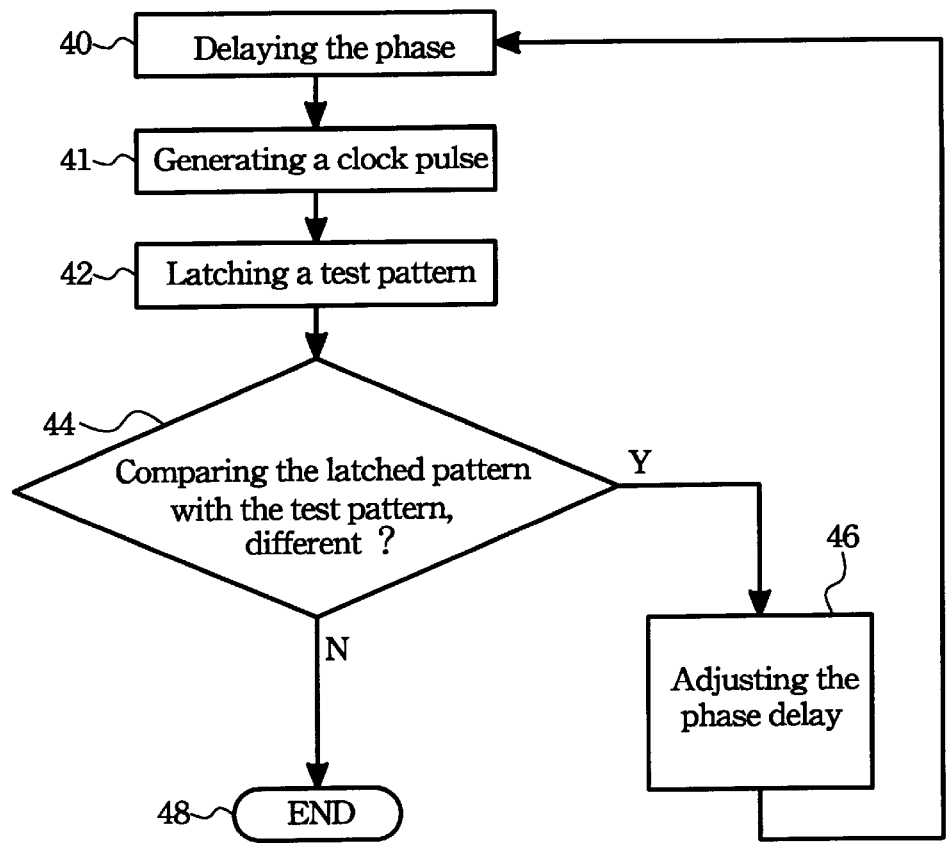
FIG. 5 illustrates a flow diagram of the method for correcting a phase of a synchronizing signal in accordance with the present invention.

For achieving a correct phase delay of the synchronizing signal, a method provided in the present invention is disclosed as follows. Referring to the flow diagram of FIG. 5, the method of phase delay correction is shown. At first, the phase of the synchronizing signal, namely the horizontal synchronizing signal is delayed in step 40. The delay in phase can be realized by the phase adjusting circuit 20. In the step 41, a clock pulse signal is then generated. The clock pulse signal can be generated by the phase lock loop (PLL) 22 from the phase delayed synchronizing signal.

Next, a latched data pattern of a data input can be generated in the step 42, by referencing the timing of the clock pulse signal. The latched data pattern can be latched by the latching circuit 24. In the preferred embodiment, a predetermined test pattern is included in the data input for making phase delay correction. The test pattern can be latched in the latching circuit 24 to generate a latched test pattern. The latched pattern is then compared with the predetermined test pattern in step 44. The latched pattern and the test pattern can be compared by the comparing circuit 26. If the latched pattern is different from the test pattern, the phase delay of the synchronizing signal is further adjusted in the step 46. The adjustment can be made with the switching circuit 28 according to the result from the comparing circuit 26. If the latched pattern is the same with the test pattern, it is concluded that a correct phase delay is achieved and the correction process of the phase delay is ended. Therefore, the step 40 of delaying the phase, the step 41 of generating the clock pulse signal, the step 42 of latching the latched pattern, the step 44 of comparing the latched pattern and the test pattern, and the step 46 of adjusting the phase delay are repeated until the latched pattern is coincident with the test pattern.

Figure 6:
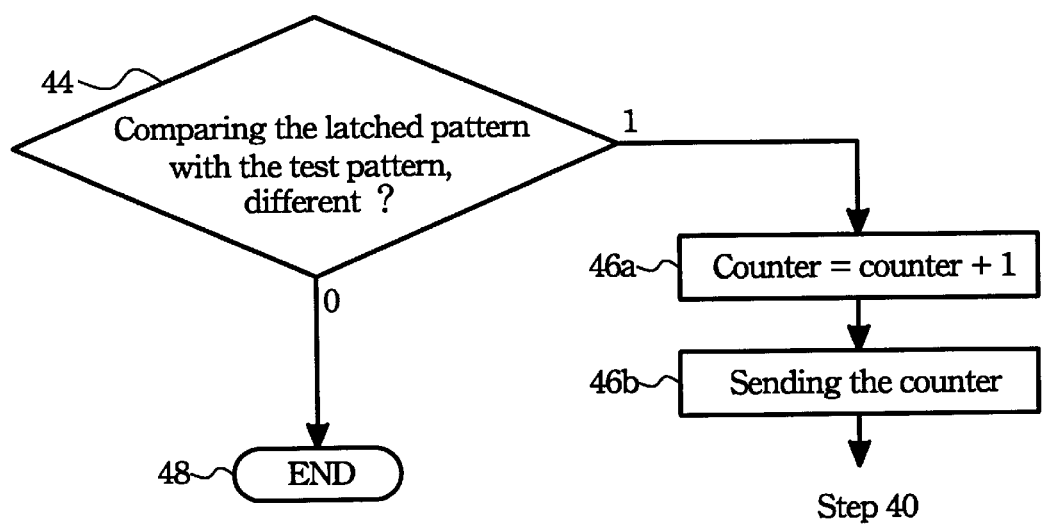
FIG. 6 illustrates a flow diagram of the steps of adjusting the phase delay in accordance with the present invention.

As an example, for making a correct phase delay, the test pattern can be send or included in the data input. In the case, a test pattern of six bits like "101010" can be employed. A test pattern with different number of bits or various kind of contents can be selected alternatively under a different system design or specifications. In the preferred embodiment, the test pattern can be send at a rising edge or at a falling edge of the synchronizing signal. The latched pattern is compared with the predetermined test pattern. If the two patterns are different, a logic state of "1" representing a "true" state can be send out, as illustrated in FIG. 6. The switching circuit 28 can be a logic circuit for generating a binary signal from a counter value to the controlling pins B0, B1, B2, B3, B4, and B5. In the case, the step 46 of adjusting the phase delay can be realized by the steps 46*a* and 46*b*. If a true state is send from the comparing circuit 26, a counter value initialized at zero is added by one in step 46*a*. Then the counter value is send out as a binary controlling signal to the controlling pins.

At the initial state, the binary controlling signal is "000000" to give B5=0, B4=0, B3=0, B2=0, B1=0, and B0=0. The six switches S5, S4, S3, S2, S1, and S0 in FIG. 4 are switched to the bypass states without passing the six resistors. Thus the resistance in the RC circuit 20*a* is the resistance of the resistor R0, which can be set equal to R. If a true state is send out as the comparing result, the counter value is increased by one in the step 46*a*. The binary controlling signal of "000001" representing the counter value is send in the step 46*b* to give B5=0, B4=0, B3=0, B2=0, B1=0, and B0=1. Five switches S5, S4, S3, S2, and S1 in FIG. 4 are switched to the bypass states. The switch S0 is set to connect the resistor R and thus the resistance in the RC circuit 20*a* is 2 R. In the same way, the counter value is increased with a step value of 1 each time a true state, which represents the difference of the two patterns, is send out as the comparing result. By switching the six switches under the controlling signal, the resistance of the RC circuit 20*a* is increased from R to 2 R, 3 R, 4 R, 5 R, 6 R, until 64 R., with the step of 1 R. The maximum resistance which can be achieved in the example is 64 R. If the counter is added to be "111111", adding 1 in a next step would make to return to 0, namely "000000". The correction in phase delay is continued until the latched test pattern is coincident with the original test pattern, then to the end step 48. Therefore, the phase delay of the system can be adjusted automatically to the best timing of the clock pulse signal, in order to enable the correct latching of the data input or the data signal of a video system. Thus a series of correct images without incorrect latching can be achieved and the problem like distortion can be avoided with the method and the apparatus disclosed in the present invention.

As is understood by a person skilled in the art, the foregoing descriptions of the preferred embodiment of the present invention is an illustration of the present invention rather than a limitation thereon. It is intended to cover various modifications and similar arrangements included within the spirit and scope of the appended claims. The scope of the claims should be accorded to the broadest interpretation so as to encompass all such modifications and similar structures. While the preferred embodiment of the invention has been illustrated and described, it will be appreciated that various changes can be made therein without departing from the spirit and scope of the invention.

What is claimed is:

1. An apparatus for correcting a phase of a synchronizing signal, said apparatus comprising:

means for adjusting said phase of said synchronizing signal;

phase lock loop means being responsive to said phase adjusting means for generating a clock pulse signal;

latching means being responsive to a test pattern of a data input and said phase lock loop means for generating a latched pattern of said test pattern;

means for comparing said latched pattern with said test pattern; and switching means being responsive to said comparing means for varying a time delay of said phase adjusting means.

2. The apparatus of claim 1, wherein said synchronizing signal comprises a video synchronizing signal.

3. The apparatus of claim 2, wherein said video synchronizing signal is a horizontal synchronizing signal.

4. The apparatus of claim 1, wherein said phase adjusting means comprises a RC circuit.

5. The apparatus of claim 4, wherein said RC circuit comprises a plurality of resistors.

6. The apparatus of claim 5, wherein said switching means varies said time delay of said phase adjusting means by switching said plurality of resistors.

7. The apparatus of claim 1, wherein said test pattern is send at a rising edge of said synchronizing signal.

8. The apparatus of claim 1, wherein said test pattern is send at a falling edge of said synchronizing signal.

9. The apparatus of claim 1 further comprising a switch for said latching means for switching an input of said data input.

10. A method for correcting a phase of a synchronizing signal, said method comprising the steps of:

delaying said phase of said synchronizing signal;

generating a clock pulse signal from a phase delayed synchronizing signal;

latching a latched pattern from a test pattern of a data input by referencing said clock pulse signal;

comparing said latched data pattern with said data input; and if said latched pattern is different from test pattern, adjusting a phase delay of said synchronizing signal.

11. The method of claim 10, wherein the steps of delaying said phase, generating said clock pulse signal, latching said latched pattern, comparing said latched pattern and said test pattern, and adjusting said phase delay are repeated until said latched pattern is coincident with said test pattern.

12. The method of claim 10, wherein said synchronizing signal comprises a video synchronizing signal.

13. The method of claim 12, wherein said video synchronizing signal is a horizontal synchronizing signal.

14. The method of claim 10, wherein said phase of said synchronizing signal is delayed by a RC circuit.

15. The method of claim 14, wherein said phase delay is adjusted by switching a plurality of resistors of said RC circuit.

16. The method of claim 10, wherein said test pattern is send at a rising edge of said synchronizing signal.

17. The method of claim 10, wherein said test pattern is send at a falling edge of said synchronizing signal.

* * * * *